US009640712B2

United States Patent
Lai et al.

(10) Patent No.: US 9,640,712 B2
(45) Date of Patent: May 2, 2017

(54) NITRIDE SEMICONDUCTOR STRUCTURE AND SEMICONDUCTOR LIGHT EMITTING DEVICE INCLUDING THE SAME

(71) Applicant: Genesis Photonics Inc., Tainan (TW)

(72) Inventors: Yen-Lin Lai, Tainan (TW); Shen-Jie Wang, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 14/732,798

(22) Filed: Jun. 8, 2015

(65) Prior Publication Data

US 2015/0270433 A1    Sep. 24, 2015

Related U.S. Application Data

(63) Continuation of application No. 13/963,109, filed on Aug. 9, 2013, now Pat. No. 9,076,912.

(30) Foreign Application Priority Data

Nov. 19, 2012   (TW) .............................. 101143101 A

(51) Int. Cl.
  *H01L 33/14*   (2010.01)
  *H01L 33/28*   (2010.01)
  (Continued)

(52) U.S. Cl.
  CPC .......... *H01L 33/0025* (2013.01); *H01L 33/06* (2013.01); *H01L 33/145* (2013.01); *H01L 33/32* (2013.01); *H01L 33/325* (2013.01)

(58) Field of Classification Search
  CPC .......... H01L 33/32; H01L 33/06; H01L 33/42; H01L 33/405; H01L 33/14; H01L 33/04;
  (Continued)

(56) References Cited

U.S. PATENT DOCUMENTS 6,252,894 B1   6/2001   Sasanuma et al.
6,278,054 B1   8/2001   Ho et al.
(Continued)

FOREIGN PATENT DOCUMENTS

CN   101188264   5/2008
CN   101267008   9/2008
(Continued)

OTHER PUBLICATIONS

"Office Action of U.S. Related Application" U.S. Appl. No. 14/257,012, issued on Dec. 29, 2014, p. 1-p. 11.
(Continued)

*Primary Examiner* — Kimberly Rizkallah
*Assistant Examiner* — Brian Turner
(74) *Attorney, Agent, or Firm* — Jianq Chyun IP Office

(57) ABSTRACT

A nitride semiconductor structure and a semiconductor light emitting device including the same are revealed. The nitride semiconductor structure includes a multiple quantum well structure formed by a plurality of well layers and barrier layers stacked alternately. One well layer is disposed between every two barrier layers. The barrier layer is made of $Al_xIn_yGa_{1-x-y}N$ (0<x<1, 0<y<1, 0<x+y<1) while the well layer is made of $In_zGa_{1-z}N$ (0<z<1). Thereby quaternary composition is adjusted for lattice match between the barrier layers and the well layers. Thus crystal defect caused by lattice mismatch is improved.

19 Claims, 2 Drawing Sheets

(51) Int. Cl.
  *H01L 33/30* (2010.01)
  *H01L 33/32* (2010.01)
  *H01L 33/00* (2010.01)
  *H01L 33/06* (2010.01)

(58) Field of Classification Search
  CPC ............ H01L 33/0025; H01L 33/0066; H01L 33/007; H01L 33/12; H01L 33/145
  USPC ........ 257/13, 43, 94, 96, 190, 615, E29.089, 257/E33.023; 438/2, 29, 46–47, 478–509
  See application file for complete search history.

(56) References Cited

U.S. PATENT DOCUMENTS

| | | | |
|---|---|---|---|
| 6,319,742 | B1 | 11/2001 | Hayashi et al. |
| 7,208,752 | B2 | 4/2007 | Lai et al. |
| 7,759,694 | B2 | 7/2010 | Komada |
| 8,575,592 | B2 | 11/2013 | Bergmann et al. |
| 8,604,461 | B2 | 12/2013 | Driscoll et al. |
| 8,942,269 | B2 | 1/2015 | Kasugai et al. |
| 9,147,800 | B2 | 9/2015 | Lai et al. |
| 2002/0014632 | A1 | 2/2002 | Kaneyama et al. |
| 2002/0158259 | A1 | 10/2002 | Ono et al. |
| 2003/0085409 | A1 | 5/2003 | Shen et al. |
| 2004/0058465 | A1 | 3/2004 | Taki |
| 2004/0264533 | A1* | 12/2004 | Matsumura ............ H01S 5/223 372/45.01 |
| 2005/0127391 | A1 | 6/2005 | Yanamoto |
| 2006/0097270 | A1 | 5/2006 | Yuri |
| 2006/0175600 | A1 | 8/2006 | Sato et al. |
| 2007/0040240 | A1 | 2/2007 | Dwilinski et al. |
| 2007/0096077 | A1* | 5/2007 | Sanga .................. H01L 29/205 257/13 |
| 2008/0081390 | A1 | 4/2008 | Gaska et al. |
| 2008/0135829 | A1 | 6/2008 | Lee |
| 2008/0135868 | A1 | 6/2008 | Okagawa et al. |
| 2008/0315179 | A1 | 12/2008 | Kim et al. |
| 2008/0315243 | A1 | 12/2008 | Ueno et al. |
| 2009/0016397 | A1 | 1/2009 | Terano et al. |
| 2009/0026489 | A1 | 1/2009 | Kuramoto |
| 2009/0057696 | A1 | 3/2009 | Kuo et al. |
| 2010/0019222 | A1 | 1/2010 | Yan et al. |
| 2010/0034231 | A1 | 2/2010 | Fukuda et al. |
| 2010/0044674 | A1 | 2/2010 | Kim |
| 2010/0133506 | A1 | 6/2010 | Nakanishi et al. |
| 2010/0142576 | A1 | 6/2010 | Cohen et al. |
| 2010/0213436 | A1 | 8/2010 | Khan |
| 2010/0219445 | A1 | 9/2010 | Yokoyama et al. |
| 2010/0243985 | A1 | 9/2010 | Yan et al. |
| 2010/0289067 | A1 | 11/2010 | Mishra et al. |
| 2011/0001126 | A1* | 1/2011 | Kamikawa et al. ............ 257/14 |
| 2011/0114916 | A1* | 5/2011 | Yoshizumi ............ B82Y 20/00 257/13 |
| 2011/0147763 | A1 | 6/2011 | Hanawa et al. |
| 2012/0217473 | A1 | 8/2012 | Shur et al. |
| 2013/0001585 | A1* | 1/2013 | Tsuchiya ............... H01L 29/861 257/76 |
| 2013/0228741 | A1 | 9/2013 | Fu |
| 2013/0228743 | A1 | 9/2013 | Fu et al. |
| 2014/0138616 | A1 | 5/2014 | Huang et al. |
| 2014/0138617 | A1 | 5/2014 | Lai et al. |
| 2014/0138618 | A1 | 5/2014 | Wu et al. |
| 2014/0138619 | A1 | 5/2014 | Lai et al. |
| 2015/0179874 | A1 | 6/2015 | Li |
| 2015/0263226 | A1 | 9/2015 | Huang et al. |

FOREIGN PATENT DOCUMENTS

| | | |
|---|---|---|
| CN | 101276875 | 10/2008 |
| CN | 101461069 | 6/2009 |
| CN | 101488548 | 7/2009 |
| CN | 101527341 | 9/2009 |
| CN | 101542760 | 9/2009 |
| CN | 101685844 | 3/2010 |
| CN | 101807640 | 8/2010 |
| CN | 101494265 | 3/2011 |
| CN | 102150288 | 8/2011 |
| CN | 102157646 | 8/2011 |
| CN | 102185056 | 9/2011 |
| CN | 102201514 | 9/2011 |
| CN | 102208511 | 10/2011 |
| CN | 102214739 | 10/2011 |
| CN | 102214740 | 10/2011 |
| CN | 101645480 | 5/2012 |
| CN | 102474076 | 5/2012 |
| CN | 102569571 | 7/2012 |
| CN | 102637787 | 8/2012 |
| CN | 102738328 | 10/2012 |
| CN | 102751393 | 10/2012 |
| CN | 103972339 | 8/2014 |
| CN | 103972340 | 8/2014 |
| CN | 103972342 | 8/2014 |
| JP | H08330630 | 12/1996 |
| JP | H10144960 | 5/1998 |
| JP | 2000196143 | 7/2000 |
| JP | 2004134750 | 4/2004 |
| JP | 2007-227671 | 9/2007 |
| JP | 2009021361 | 1/2009 |
| JP | 2009152448 | 7/2009 |
| JP | 2011-023541 | 2/2011 |
| JP | 2011-249776 | 12/2011 |
| TW | 200529464 | 9/2005 |
| TW | 200908393 | 2/2009 |
| TW | 201011952 | 3/2010 |
| TW | 201135967 | 10/2011 |
| TW | 201208112 | 2/2012 |
| TW | 201222869 | 6/2012 |
| TW | 201242085 | 10/2012 |
| TW | 201338196 | 9/2013 |
| WO | 0248434 | 6/2002 |
| WO | 2007105882 | 9/2007 |
| WO | 2012127778 | 9/2012 |

OTHER PUBLICATIONS

"Office Action of Taiwan Related Application" application No. 102148234, issued on Aug. 18, 2015, p. 1-p. 6.
"Office Action of U.S. Related Application" U.S. Appl. No. 13/963,127, issued on Jan. 2, 2015, p. 1-p. 8.
"Office Action of Taiwan Related Application" application No. 101143153, issued on Sep. 29, 2014, p. 1-p. 5.
"Office Action of TW Related Application" application No. 101143155, issued on Mar. 9, 2015, p. 1-p. 4.
"Office Action of Japan Related Application" application No. 2013183282, issued on Sep. 22, 2014, p. 1-p. 4.
"Response to Office Action of Japan Related Application" application No. 2013183282, submission on Dec. 16, 2014, p. 1-p. 8.
"Office Action of Japan Related Application" application No. 2013183282, issued on Apr. 7, 2015, p. 1-p. 5.
"Written Appeal of Japan Related Application" application No. 2013183282, submission on Aug. 7, 2015, p. 1-p. 21.
"Office Action of Taiwan Related Application" application No. 101150593, issued on Nov. 21, 2014, p. 1-p. 6.
"Office Action of Taiwan Related Application" application No. 101150695, issued on Feb. 24, 2015, p. 1-p. 6.
"Notice of Allowance of Japan Related Application" application No. 2013183282, issued on Oct. 20, 2015, p. 1-p. 3.
"Office Action of Taiwan Counterpart Application", issued on Jan. 21, 2016, p. 1-p. 5.
"Office Action of China Related Application No. 201310028759.6", issued on Mar. 4, 2016, p. 1-p. 6.
"Office Action of Taiwan Counterpart Application No. 104124479", issued on May 19, 2016, p. 1-p. 7.
"Office Action of Related U.S. Appl. No. 14/727,786", issued on Mar. 3, 2016, p. 1-p. 25.
"Office Action of Japan Related Application No. 2015-156949", issued on May 31, 2016, p. 1-p. 2.
"Office Action of Taiwan Related Application No. 104128296", issued on Feb. 17, 2016, p. 1-p. 5.

(56) References Cited

OTHER PUBLICATIONS

"Office Action of China Related Application No. 201310029901.9", issued on Feb. 23, 2016, p. 1-p. 7.
"Office Action of China Related Application No. 201310029644.9", issued on Mar. 2, 2016, p. 1-p. 5.
"Office Action of China Related Application No. 201310029679.2", issued on Mar. 3, 2016, p. 1-p. 7.
"Office Action of China Related Application No. 201310030319.4", issued on Mar. 3, 2016, p. 1-p. 7.
"Office Action of China Related Application No. 201310029711.7", issued on Mar. 3, 2016, p. 1-p. 7.
"Office Action of China Counterpart Application", issued on Jul. 29, 2016, p. 1-p. 7.
"Office Action of US Related Application, application No. 14850970", issued on Nov. 1, 2016, p. 1-p. 15.
"Office Action of CN Related Application, application No. 201310029644.9", issued on Nov. 1, 2016, p. 1-p. 8.
"Office Action of China Related Application, application No. 2014100145405.5", issued on Dec. 20, 2016, p1-p6, in which the listed references was cited.

\* cited by examiner

NITRIDE SEMICONDUCTOR STRUCTURE AND SEMICONDUCTOR LIGHT EMITTING DEVICE INCLUDING THE SAME

CROSS-REFERENCE TO RELATED APPLICATION

This is a continuation application of and claims the priority benefit of U.S. application Ser. No. 13/963,109, filed on Aug. 9, 2013, now allowed, which claims the priority benefit of Taiwan application serial no. 101143101, filed on Nov. 19, 2012. The entirety of each of the above-mentioned patent applications is hereby incorporated by reference herein and made a part of this specification.

BACKGROUND OF THE INVENTION

1. Field of the Invention

The present invention relates to a nitride semiconductor structure and a semiconductor light emitting device including the same, especially to a nitride semiconductor structure that has a multiple quantum well structure formed by quaternary AlGaInN barrier layers and ternary InGaN well layers for reducing stress coming from lattice mismatch. The thickness of the well layer is ranging from 3.5 nm to 7 nm. At the same time, a better carrier confinement is provided and the internal quantum efficiency is improved. Thus the semiconductor light emitting device has a better light emitting efficiency.

2. Description of Related Art

Generally, a nitride light emitting diode is produced by forming a buffer layer on a substrate first. Then a n-type semiconductor layer, a light emitting layer and a p-type semiconductor layer are formed on the buffer layer in turn by epitaxial growth. Next use photolithography and etching processes to remove a part of the p-type semiconductor layer and a part of the light emitting layer until a part of the n-type semiconductor layer is exposed. Later a n-type electrode and a p-type electrode are respectively formed on the exposed n-type semiconductor layer and the p-type semiconductor layer. Thus, a light emitting diode device is produced. The light emitting layer has a multiple quantum well (MQW) structure formed by a plurality of well layers and barrier layers disposed alternately. The band gap of the well layer is lower than that of the barrier layer so that electrons and holes are confined by each well layer of the MQW structure. Thus electrons and holes are respectively injected from the n-type semiconductor layer and the p-type semiconductor layer to be combined with each other in the well layers and photons are emitted.

In the MQW structure, there are about 1-30 layers of well layers or barrier layers. The barrier layer is usually made of GaN while the well layer is made of InGaN. However, there is about 10~15% lattice mismatch between GaN and InGaN that causes a large stress in the lattice. Thus a piezoelectric field is induced in the MQW structure by the stress. Moreover, during growth of InGaN, the higher indium composition, the larger the piezoelectric field generated. The piezoelectric field has a greater impact on the crystal structure. The stress accumulated is getting larger along with the increasing thickness during growth of InGaN. After the crystal structure being grown over a critical thickness, larger defects (such as V-pits) are present due to the stress, so that the thickness of the well layer has a certain limit, generally about 3 nm.

Moreover, in the MQW structure, band gap is tilted or twisted due to effects of a strong polarization field. Thus electrons and holes are separated and confined on opposite sides of the well layer, which leads to decrease the overlapping of the wave function of the electron hole pairs and further to reduce both radiative recombination rate and internal quantum efficiency of electron hole pairs.

SUMMARY OF THE INVENTION

A nitride semiconductor structure comprising a first type doped semiconductor layer; a light emitting layer, comprising a multiple quantum well (MQW) structure; an AlGaN based second type carrier blocking layer; and a second type doped semiconductor layer, wherein the AlGaN based second type carrier blocking layer is disposed between the second type doped semiconductor layer and the light emitting layer, and the light emitting layer is disposed between the AlGaN based second type carrier blocking layer and the first type doped semiconductor layer, and the MQW structure comprises a plurality of AlInGaN based barrier layers and a plurality of InGaN based well layers stacked alternately.

A nitride semiconductor structure comprising: a first type doped semiconductor layer; a light emitting layer, comprising a multiple quantum well (MQW) structure; a InGaN based hole supply layer; and a second type doped semiconductor layer, wherein the light emitting layer is disposed between the first type doped semiconductor layer and the InGaN based hole supply layer, and the InGaN based hole supply layer is disposed between the light emitting layer and the second type doped semiconductor layer, and the MQW structure comprises a plurality of AlInGaN based barrier layers and a plurality of InGaN based well layers stacked alternately, and the band gap of the hole supply layer is larger than that of the InGaN based well layers.

A nitride semiconductor structure comprising: a first type doped semiconductor layer; a AlGaN based first type carrier blocking layer; a light emitting layer, comprising a multiple quantum well (MQW) structure; a AlGaN based second type carrier blocking layer; and a second type doped semiconductor layer, wherein the light emitting layer is disposed between the first type doped semiconductor layer and the second type doped semiconductor layer, the AlGaN based first type carrier blocking layer is disposed between the first type doped semiconductor layer and the light emitting layer, the AlGaN based second type carrier blocking layer is disposed between the second type doped semiconductor layer and the light emitting layer, and the MQW structure comprises a plurality of AlInGaN based barrier layers and a plurality of InGaN based well layers stacked alternately.

By the quaternary AlGaInN barrier layers and the ternary InGaN well layers, the stress caused by lattice mismatch is improved and the piezoelectric field in the MQW structure is further reduced effectively. Thus inhibition of the piezoelectric effect and improvement of internal quantum efficiency are achieved. Therefore the semiconductor light emitting device gets a better light emitting efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

In the following embodiments, when it is mentioned that a layer of something or a structure is disposed over or under a substrate, another layer of something, or another structure, that means the two structures, the layers of something, the layer of something and the substrate, or the structure and the substrate can be directly or indirectly connected. The indirect connection means there is at least one intermediate layer disposed therebetween.

Figure 1:
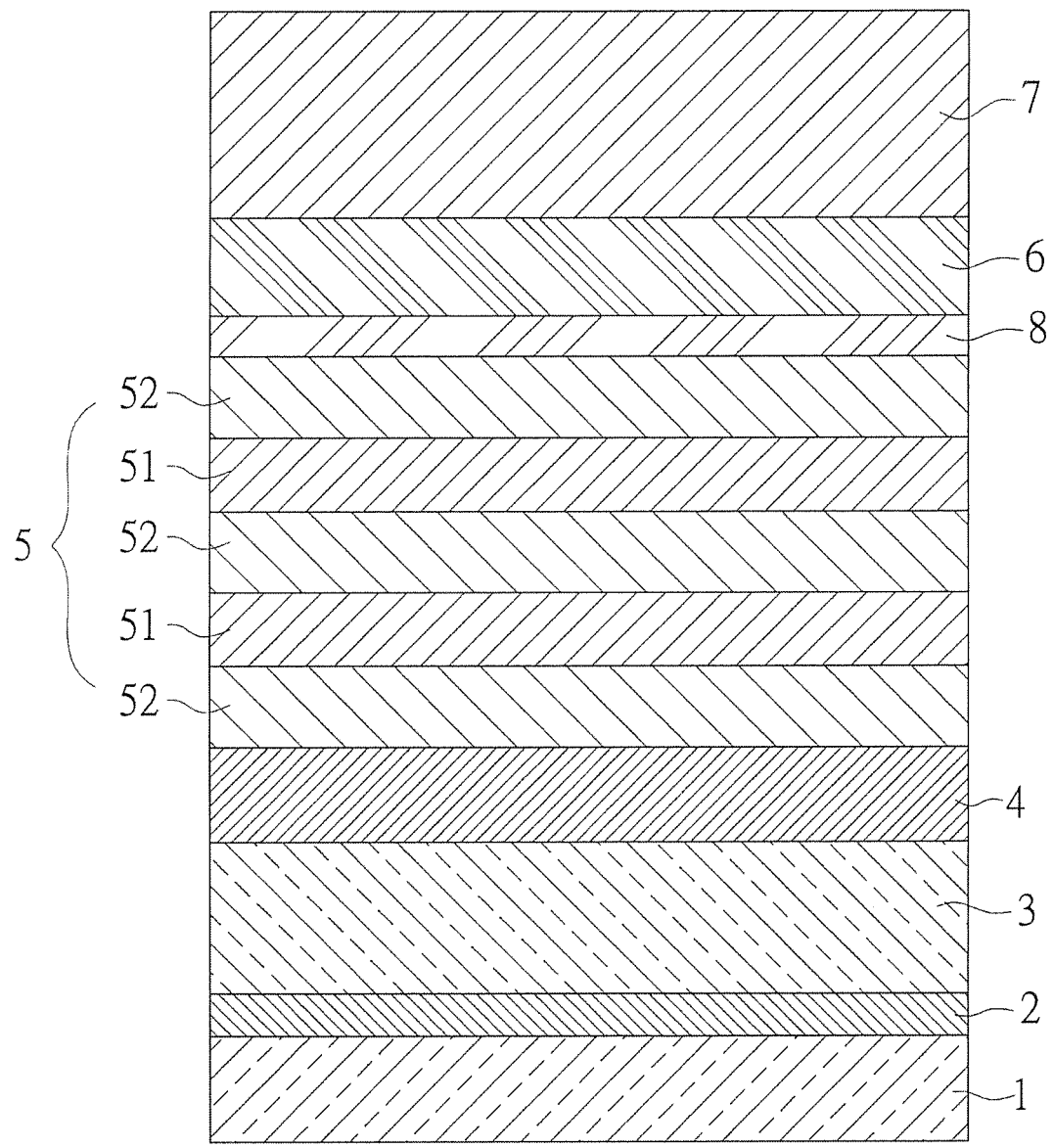
FIG. 1 is a schematic drawing showing a cross section of an embodiment of a nitride semiconductor structure according to the present invention.

Referring to FIG. 1, a first type doped semiconductor layer 3 and a second type doped semiconductor layer 7 are disposed over a substrate 1. A light emitting layer 5 is disposed between the first type doped semiconductor layer 3 and the second type doped semiconductor layer 7. The light emitting layer 5 has a multiple quantum well (MQW) structure. The MQW structure includes a plurality of well layers 51 and barrier layers 52 stacked alternately. One well layer 51 is disposed between every two barrier layers 52. The barrier layer 52 is made of quaternary AlxInyGa1-x-yN ($0<x<1$, $0<y<1$, $0<x+y<1$) and the well layer 51 is made of material $In_zGa_{1-z}N$ ($0<z<1$). The thickness of the well layer 51 is ranging from 3.5 nm to 7 nm, preferably from 4 nm to 5 nm. The thickness of the barrier layer 52 is ranging from 5 nm to 12 nm. The barrier layer 52 is doped with a first type dopant (such as silicon or germanium) at a concentration ranging from $10^{16}$ cm$^{-3}$ to $10^{18}$ cm$^{-3}$ so as to reduce carrier screening effect and increase carrier-confinement.

Moreover, a hole supply layer 8 is disposed between the light emitting layer 5 and the second type doped semiconductor layer 7. The hole supply layer 8 is made of $In_xGa_{1-x}N$ ($0<x<1$) and is doped with a second type dopant (such as magnesium or zinc) at a concentration larger than $10^{18}$ cm$^{-3}$. The hole supply layer 8 is also doped with a Group IV A element whose concentration is ranging from $10^{17}$ cm$^{-3}$ to $10^{20}$ cm$^{-3}$. The optimal Group IV A element is carbon. The pentavalent nitrogen is replaced by carbon, so that the hole supply layer 8 has higher concentration of holes and more holes are provided to enter the light emitting layer 5. Thus the electron-hole recombination is increased. The band gap of the hole supply layer 8 is larger than that of the well layer 51 of MQW structure, so that the holes are allowed to enter the well layers and the electrons will not escape into the second type doped semiconductor layer 7.

Furthermore, a first type carrier blocking layer 4 made of material $Al_xGa_{1-x}N$ ($0<x<1$) is disposed between the light emitting layer 5 and the first type doped semiconductor layer 3 while a second type carrier blocking layer 6 made of $Al_xGa_{1-x}N$ ($0<x<1$) is disposed between the hole supply layer 8 and the second type doped semiconductor layer 7. Due to the property that the band gap of AlGaN containing aluminum is larger than that of the GaN, not only the range of band gap of the nitride semiconductor is increased, the carriers are confined in the MQW structure. Thus the electron-hole recombination rate is increased and the light emitting efficiency is improved.

In addition, a buffer layer 2 made of $Al_xGa_{1-x}N$ ($0<x<1$) is disposed between the substrate 1 and the first type doped semiconductor layer 3. The buffer layer 2 is for improving lattice mismatch caused by the first type doped semiconductor layer 3 grown on the heterogeneous substrate 1. The materials for the buffer layer 2 can also be GaN, InGaN, SiC, ZnO, etc. The buffer layer is produced by a low-temperature epitaxial growth at the temperature ranging from 400 degrees Celsius (° C.) to 900° C.

While in use, the material for the substrate 1 can be sapphire, silicon, SiC, ZnO or GaN, etc. The first type doped semiconductor layer 3 is made of Si-doped or Ge-doped GaN-based materials while the second type doped semiconductor layer 7 is made of Mg-doped or Zn-doped GaN-based materials. The first type doped semiconductor layer 3 and the second type doped semiconductor layer 7 are produced by the method such as metalorganic chemical vapor deposition (MOCVD). As to the well layer 51 and the barrier layer 52, they are produced by metal organic chemical vapor deposition or molecular beam epitaxy (MBE) deposition of gas mixture of a lower alkyl group-indium and gallium compound. The barrier layers 52 are deposited at the temperature ranging from 850° C. to 1000° C. while the well layers 51 are formed at the temperature ranging from 500° C. to 950° C. The AlGaInN barrier layers 52 and the InGaN well layers 51 of the MQW structure have the same element-indium so that the lattice constant of the barrier layers 52 and the lattice constant of the well layers 51 are similar. Thus not only crystal defects caused by lattice mismatch between conventional InGaN well layers and GaN barrier layers can be improved, the stress caused by lattice constant mismatch between materials is also improved. The thickness of the well layer 51 of the nitride semiconductor structure is ranging from 3.5 nm to 7 nm, preferably from 4 nm to 5 nm.

Moreover, the piezoelectric field in the MQW structure is effectively reduced because that the quaternary AlGaInN barrier layers 52 and InGaN well layers 51 can improve the stress caused by lattice mismatch. Thus the tilted and twisted energy band is improved in a certain degree. Therefore the piezoelectric effect is reduced effectively and the internal quantum efficiency is increased.

Figure 2:
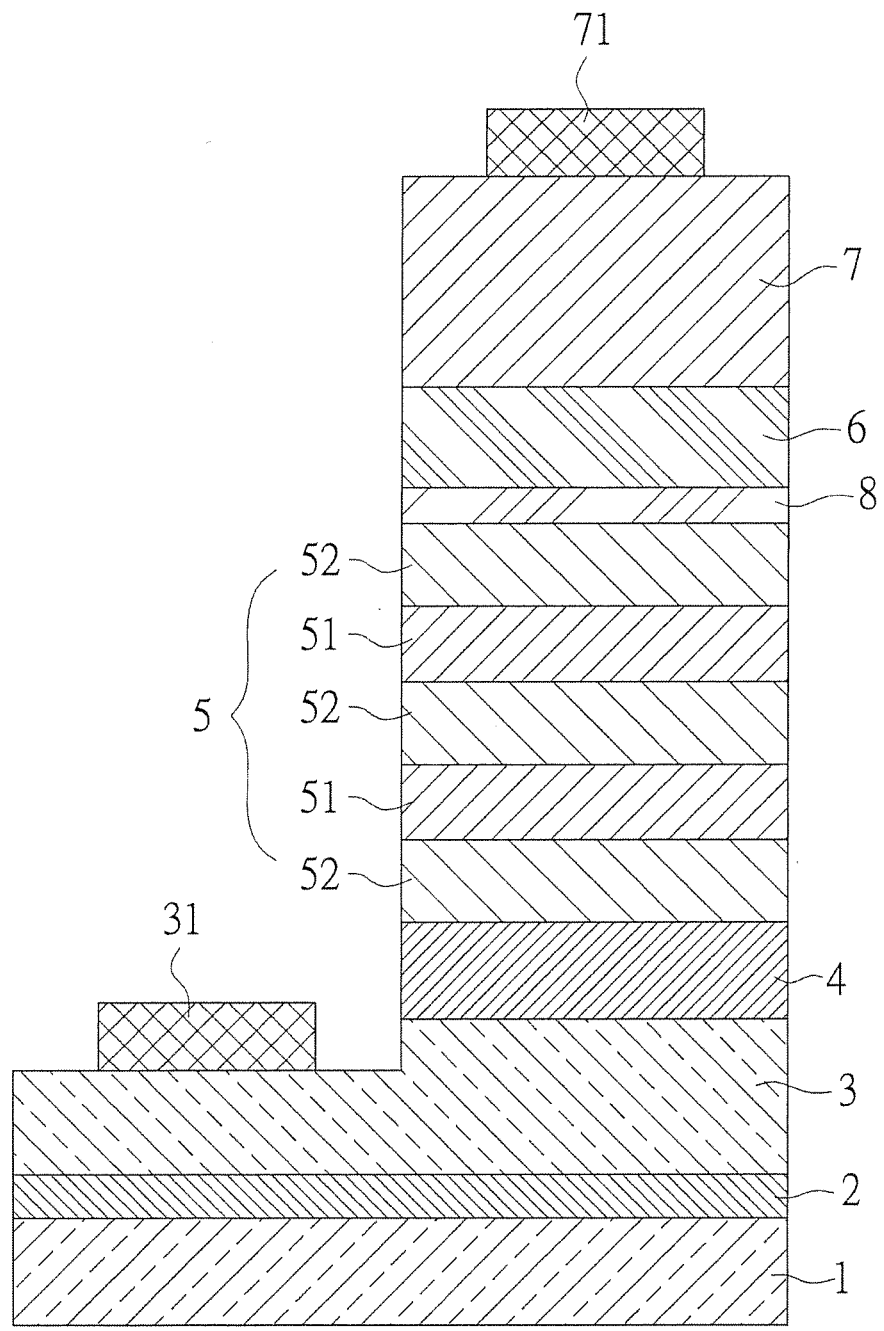
FIG. 2 is a schematic drawing showing a cross section of an embodiment of a semiconductor light emitting device including a nitride semiconductor structure according to the present invention.

The above nitride semiconductor structure is applied to semiconductor light emitting devices. Referring to FIG. 2, a cross section of a semiconductor light emitting device including the nitride semiconductor structure of an embodiment according to the present invention is revealed. The semiconductor light emitting device includes at least: a substrate 1, a first type doped semiconductor layer 3 disposed over the substrate 1 and made of Si-doped or Ge-doped GaN based materials, a light emitting layer 5 disposed over the first type doped semiconductor layer 3 and having a multiple quantum well (MQW) structure, a second type doped semiconductor layer 7 disposed over the light emitting layer 5 and made of Mg-doped or Zn-doped GaN based materials, a first type electrode 31 disposed on and in ohmic contact with the first type doped semiconductor layer 3, and a second type electrode 71 disposed on and in ohmic contact with the second type doped semiconductor layer 7.

The MQW structure includes a plurality of well layers 51 and barrier layers 52 stacked alternately. One well layer 51 is disposed between every two barrier layers 52. The barrier layer 52 is made of material $Al_xIn_yGa_{1-x-y}N$ and x and y satisfy the conditions: $0<x<1$, $0<y<1$, and $0<x+y<1$ while the well layer 51 is made of material $In_zGa_{1-z}N$ and $0<z<1$. The thickness of the well layer 51 is ranging from 3.5 nm to 7 nm, preferably from 4 nm to 5 nm.

The first type electrode 31 and the second type electrode 71 are used together to provide electric power and are made of (but not limited to) the following materials titanium, aluminum, gold, chromium, nickel, platinum, and their alloys. The manufacturing processes are well-known to people skilled in the art.

Moreover, a first type carrier blocking layer 4 made of material $Al_xGa_{1-x}N$ (0<x<1) is disposed between the light emitting layer 5 and the first type doped semiconductor layer 3 while a second type carrier blocking layer 6 made of material $Al_xGa_{1-x}N$ (0<x<1) is disposed between the light emitting layer 5 and the second type doped semiconductor layer 7. Due to the property that the band gap of AlGaN containing aluminum is larger than that of GaN, not only the range of the band gap of the nitride semiconductor is increased, the carriers are also confined in the MQW structure. Thus the electron-hole recombination rate is increased and the light emitting efficiency is further improved.

A buffer layer 2 made of $Al_xGa_{1-x}N$ (0<x<1) is disposed between the substrate 1 and the first type doped semiconductor layer 3 so as to improve lattice constant mismatch caused by the first type doped semiconductor layer 3 grown on the heterogeneous substrate 1. The buffer layer 2 can also be made of material including GaN, InGaN, SiC, ZnO, etc.

In summary, due to that both quaternary AlGaInN barrier layers 52 and ternary InGaN well layers 51 have the same element-indium, the quaternary composition of the semiconductor light emitting device of the present invention can be adjusted and improved for providing a lattice matching composition that allows the barrier layers 52 and the well layers 51 to have similar lattice constants. Thus not only crystal defects caused by lattice mismatch between conventional InGaN well layers and GaN barrier layers can be improved, the stress caused by lattice mismatch is also improved. The thickness of the well layer 51 of the nitride semiconductor structure is ranging from 5 nm to 7 nm, preferably from 4 nm to 5 nm. Moreover, the addition of more aluminum (Al) in the barrier layer 52 provides a better carrier confinement and electrons and holes are effectively confined in the well layer 51. Thereby the internal quantum efficiency is increased and the semiconductor light emitting device provides a better light emitting efficiency.

Furthermore, the quaternary AlGaInN barrier layers and the ternary InGaN well layers can improve the stress caused by lattice mismatch and further reduce the piezoelectric field in the MQW structure effectively. Thus the piezoelectric effect is inhibited and the internal quantum efficiency is improved. Therefore the semiconductor light emitting device gets a better light emitting efficiency.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A nitride semiconductor structure comprising:
a first type doped semiconductor layer;
a light emitting layer, comprising a multiple quantum well (MQW) structure, wherein the MQW structure comprises a plurality of barrier layers and a plurality of well layers stacked alternately;
an GaN based hole supply layer comprising indium, doped with a second type dopant at a concentration larger than $10^{18}$ cm$^{-3}$ and doped with carbon at a concentration larger than $10^{17}$ cm$^{-3}$;
an GaN based second type carrier blocking layer comprising aluminum, wherein the GaN based hole supply layer is disposed between the light emitting layer and the GaN based second type carrier blocking layer; and
a second type doped semiconductor layer, wherein the GaN second type carrier blocking layer is disposed between the second type doped semiconductor layer and the light emitting layer, and the light emitting layer is disposed between the GaN second type carrier blocking layer and the first type doped semiconductor layer, wherein the GaN second type carrier blocking layer is sandwiched between the GaN based hole supply layer and the second type doped semiconductor layer.

2. The nitride semiconductor structure as claimed in claim 1, wherein thicknesses of the well layers range from 3.5 nm to 7 nm, and thicknesses of the barrier layers range from 5 nm to 12 nm.

3. The nitride semiconductor structure as claimed in claim 1, wherein each of the barrier layers is doped with a first type dopant at a concentration ranging from $10^{16}$ cm$^{-3}$ to $10^{18}$ cm$^{-3}$.

4. The nitride semiconductor structure as claimed in claim 1, wherein a band gap of the GaN based hole supply layer is larger than a band gap of the well layer of the multiple quantum well structure.

5. The nitride semiconductor structure as claimed in claim 1, wherein the second type dopant comprises magnesium or zinc.

6. A nitride semiconductor structure comprising:
a first type doped semiconductor layer;
a light emitting layer, comprising a multiple quantum well (MQW) structure;
an GaN based hole supply layer comprising indium, doped with a second type dopant at a concentration larger than $10^{18}$ cm$^{-3}$ and doped with carbon at a concentration larger than $10^{17}$ cm$^{-3}$, wherein the GaN based hole supply layer directly contacts the MOW structure;
a second type doped semiconductor layer, wherein the light emitting layer is disposed between the first type doped semiconductor layer and the GaN based hole supply layer, and the GaN based hole supply layer is disposed between the light emitting layer and the second type doped semiconductor layer, and the MQW structure comprises a plurality of barrier layers and a plurality of well layers stacked alternately, and the band gap of the hole supply layer is larger than that of the well layers.

7. The nitride semiconductor structure as claimed in claim 6, wherein one of the barrier layers is disposed between the GaN based hole supply layer and one of the well layers.

8. The nitride semiconductor structure as claimed in claim 6, wherein thicknesses of the well layers range from 3.5 nm to 7 nm, and thicknesses of the barrier layers range from 5 nm to 12 nm.

9. The nitride semiconductor structure as claimed in claim 6, wherein each of the barrier layers is doped with a first type dopant at a concentration ranging from $10^{16}$ cm$^{-3}$ to $10^{18}$ cm$^{-3}$.

10. The nitride semiconductor structure as claimed in claim 6, wherein the second type dopant comprises magnesium or zinc.

11. A nitride semiconductor structure comprising:
a first type doped semiconductor layer;
an GaN based first type carrier blocking layer comprising aluminum;
a light emitting layer, comprising a multiple quantum well (MQW) structure, wherein the MQW structure comprises a plurality of barrier layers and a plurality of well layers stacked alternately;
an GaN based hole supply layer comprising indium, doped with a second type dopant at a concentration larger than $10^{18}$ cm$^{-3}$ and doped with carbon at a concentration larger than $10^{17}$ cm$^{-3}$;

an GaN based second type carrier blocking layer comprising aluminum, wherein the GaN based hole supply layer is disposed between the light emitting layer and the GaN based second type carrier blocking layer; and a second type doped semiconductor layer, wherein the light emitting layer is disposed between the first type doped semiconductor layer and the second type doped semiconductor layer, the GaN based first type carrier blocking layer is disposed between the first type doped semiconductor layer and the light emitting layer, and the GaN based second type carrier blocking layer is disposed between the second type doped semiconductor layer and the light emitting layer, wherein the GaN based second type carrier blocking layer is sandwiched between the GaN based hole supply layer and the second type doped semiconductor layer.

12. The nitride semiconductor structure as claimed in claim 11, wherein thicknesses of the well layers range from 3.5 nm to 7 nm, and thicknesses of the barrier layers range from 5 nm to 12 nm.

13. The nitride semiconductor structure as claimed in claim 11, wherein each of the barrier layers is doped with a first type dopant at a concentration ranging from $10^{16}$ cm$^{-3}$ to $10^{18}$ cm$^{-3}$.

14. The nitride semiconductor structure as claimed in claim 11, wherein a band gap of the GaN based hole supply layer is larger than a band gap of the well layer of the multiple quantum well structure.

15. The nitride semiconductor structure as claimed in claim 11, wherein the second type dopant comprises magnesium or zinc.

16. A nitride semiconductor structure comprising:
a first type semiconductor layer;
a light emitting layer comprising a multiple quantum well (MQW) structure, wherein the MQW structure comprises a plurality of GaN based barrier layers and a plurality of GaN based well layers comprising indium, the barrier layers and the well layers are stacked alternately;
a second type GaN based hole supply layer comprising indium, doped with a second type dopant at a concentration larger than $10^{18}$ cm$^{-3}$ and doped with carbon at a concentration larger than $10^{17}$ cm$^{-3}$, wherein the GaN based hole supply layer directly contacts the MQW structure; and
a second type semiconductor layer, wherein the light emitting layer is disposed between the first type semiconductor layer and the second type GaN based hole supply layer, and the second type GaN based hole supply layer is disposed between the light emitting layer and the second type semiconductor layer.

17. The nitride semiconductor structure as claimed in claim 16, further comprising a second type GaN based carrier blocking layer comprising aluminum disposed between the second type GaN based hole supply layer and the second type semiconductor layer.

18. The nitride semiconductor structure as claimed in claim 16 further comprising a first type GaN based carrier blocking layer comprising aluminum disposed between the first type semiconductor layer and the light emitting layer.

19. The nitride semiconductor structure as claimed in claim 16, wherein the GaN based barrier layers are doped with a first type dopant at a concentration ranging from $10^{16}$ cm$^{-3}$ to $10^{18}$ cm$^{-3}$.

\* \* \* \* \*